(12) United States Patent
Belman

(10) Patent No.: US 11,297,721 B2
(45) Date of Patent: Apr. 5, 2022

(54) ELECTRONIC COMPONENT WITH FLEXIBLE TERMINAL

(71) Applicant: VISHAY ISRAEL LTD., Petach Tiqwa (IL)

(72) Inventor: Michael Belman, Beer-Sheva (IL)

(73) Assignee: VISHAY ISRAEL LTD., Petach Tiqwa (IL)

( * ) Notice: Subject to any disclaimer, the term of this patent is extended or adjusted under 35 U.S.C. 154(b) by 205 days.

(21) Appl. No.: 16/480,500

(22) PCT Filed: Jan. 23, 2018

(86) PCT No.: PCT/IB2018/000029
§ 371 (c)(1),
(2) Date: Jul. 24, 2019

(87) PCT Pub. No.: WO2018/138571
PCT Pub. Date: Aug. 2, 2018

(65) Prior Publication Data
US 2019/0387630 A1    Dec. 19, 2019

(30) Foreign Application Priority Data

Jan. 26, 2017 (IL) .......................................... 250305

(51) Int. Cl.
*H05K 1/18* (2006.01)
*H05K 3/34* (2006.01)
*B23K 1/00* (2006.01)
*H01G 4/248* (2006.01)
(Continued)

(52) U.S. Cl.
CPC ......... *H05K 3/3442* (2013.01); *B23K 1/0016* (2013.01); *H01G 4/248* (2013.01);
(Continued)

(58) Field of Classification Search
CPC ..................................................... H05K 3/3442
(Continued)

(56) References Cited

U.S. PATENT DOCUMENTS 5,405,476 A * 4/1995 Knecht ................ H03H 9/1014
156/292
7,362,559 B2    4/2008 Tominaga
(Continued)

FOREIGN PATENT DOCUMENTS

JP    H11-297565 A    10/1999
JP    2001015371 A    1/2001
(Continued)

OTHER PUBLICATIONS

International Search Report dated Apr. 9, 2018, corresponding application PCT/IB2018/000029.

*Primary Examiner* — Stanley Tso
(74) *Attorney, Agent, or Firm* — Volpe Koenig

(57) ABSTRACT

An electronic component comprising a body and at least one terminal for soldering the body to a carrier is provided, with the terminal comprising: an electrode arranged on a surface of the body; an outgassing layer formed on and/or surrounded by the electrode, wherein the outgassing layer is configured to outgas when being heated; and an electrically conductive cover layer formed on the outgassing layer, wherein the cover layer is electrically connected to the electrode and seals the outgassing layer in a gastight manner between the cover layer and the electrode.

12 Claims, 3 Drawing Sheets

(51) Int. Cl.
*H01R 12/57* (2011.01)
*B23K 101/36* (2006.01)
*B23K 103/00* (2006.01)

(52) U.S. Cl.
CPC ............ *H01R 12/57* (2013.01); *H05K 1/181* (2013.01); *B23K 2101/36* (2018.08); *B23K 2103/52* (2018.08); *H05K 2201/10015* (2013.01); *H05K 2201/10636* (2013.01)

(58) Field of Classification Search
USPC ......................................................... 228/121
See application file for complete search history.

(56) References Cited

U.S. PATENT DOCUMENTS

| | | | |
|---|---|---|---|
| 9,643,838 B1* | 5/2017 | Chu | B81B 7/0038 |
| 2001/0002505 A1 | 6/2001 | Ozasa | |
| 2007/0096334 A1* | 5/2007 | Kawabata | H01L 25/0652 |
| | | | 257/777 |
| 2008/0089046 A1 | 4/2008 | Sumi et al. | |
| 2012/0169217 A1* | 7/2012 | Kim | H01L 27/3251 |
| | | | 313/504 |
| 2015/0162132 A1 | 6/2015 | Kwag et al. | |
| 2016/0042868 A1 | 2/2016 | Otsuka et al. | |
| 2016/0064621 A1* | 3/2016 | Yoneda | H01L 33/0093 |
| | | | 438/27 |

FOREIGN PATENT DOCUMENTS

| | | |
|---|---|---|
| JP | 2016-072487 A | 5/2016 |
| WO | 2010/018674 A1 | 2/2010 |

* cited by examiner

ELECTRONIC COMPONENT WITH FLEXIBLE TERMINAL

CROSS REFERENCE TO RELATED APPLICATIONS

This application is a § 371 application of International Application No. PCT/IB2018/000029, filed Jan. 23, 2018, which claims priority to Israeli Patent Application No. 250305, filed Jan. 26, 2017, which are incorporated by reference as if fully set forth.

FIELD OF INVENTION

The present application relates to electronic components that comprise a body and at least one terminal for soldering the body to a carrier, for example electronic chip-type components.

BACKGROUND

Active and passive electronic chip-type components are commonly used in electronic devices. The vast majority of modern passive components, for example resistors, capacitors, inductors, thermistors, varistors and fuses, are leadless chip components, which include a chip body formed as a rigid ceramic parallelepiped with metallized ends. The metallized ends serve as the terminals of the component and are soldered to a carrier, for example a printed circuit board (PCB). The terminal ends of the chip can be metallized on for example one, three or five sides of the chip body.

While leadless chip components are smaller, have higher bandwidth and are less expensive than conventional leaded components having wire or stamped terminals, they also form rigid solder joints to the carrier. Bending or vibration of the carrier can lead to fatigue cracking in such rigid solder joints which causes the chip component to electrically and/or mechanically disconnect from the board.

In addition to board bending and vibration, fatigue cracking can also be caused by ambient temperature cycling, i.e. by subjecting the carrier to extreme and rapid changes in temperature. Chip components are predominately manufactured using ceramics, which have a relatively low Temperature Coefficient of Expansion (TCE, expressed in ppm/K). For example, alumina ceramics have a TCE of about 6 ppm/K, while a typical glass-polymer board has a TCE of about 18 ppm/K. The difference in these TCE values is called a TCE mismatch. As the component cycles through a wide range of temperatures, the TCE mismatch causes the chip components and the board to expand at different rates, which leads to fatigue cracking in the rigid solder joints.

As vibration and temperature cycling are often present in automotive and aerospace applications, there have been efforts to counteract the fatigue cracking of soldering material and the resulting electrical and mechanical disconnection of the chip components from the carrier. For example, flexible leads or terminals can be provided at the rigid chip component body. However, such leads or terminals increase both the dimensions and the cost of the component.

A flexible connection to the board can also be formed by coating the terminal electrodes with an electrically conductive elastic resin film. The conductive elastic resin film is made of a composite material, a metal-filled polymer, that is plated to form a solderable metal plating film. To take advantage of the elasticity of the conductive resin film, the metal layer plated on top of the conductive resin film often does not form a direct mechanical connection to the component body. The lack of a direct connection causes electrical current to flow in series through the plated layer, the conductive resin layer and the terminal electrodes. However, the electrical resistivity of the electrically conductive elastic resin film is non-linear and orders of magnitude higher than the electrical resistivity of the metals that are typically used to construct terminal electrodes, for example nickel or copper. This impairs the electrical characteristics of the chip component in comparison to chip components in which electric current only flows across metallic parts of the terminals.

Therefore, there remains a need for more durable chip components with improved electrical characteristics, particularly for electronic applications involving temperature cycling and vibration.

SUMMARY

Accordingly, an electronic component comprising a body and at least one terminal for soldering the body to a carrier is provided with the terminal comprising: an electrode arranged on a surface of the body; an outgassing layer formed on and/or surrounded by the electrode, wherein the outgassing layer is configured to outgas when being heated, particularly at a soldering temperature; and an electrically conductive cover layer formed on the outgassing layer, wherein the cover layer is electrically connected to the electrode (preferably electrically connected directly to the electrode, or electrically connected via an electrically conductive intermediate layer) and seals the outgassing layer in a gastight manner between the cover layer and the electrode.

Outgassing means that the material forming the outgassing layer, for example a conductive polymer, is in stable state at room temperature. When the material is heated during soldering, the material chemically decomposes, giving off a gas. For example, when the material of outgassing layer is a metal-filled polymer such as metal-filled silicone, its thermal decomposition, i.e. destruction, may result in the emission of water vapor, carbon dioxide, and gaseous organic compounds.

The soldering temperature, i.e. the melting range of the solder used to mount and electrically connect the component to the carrier varies depending on the soldering material, for example with the melting temperature of typical lead-free solder ranging from 211° C. to 220° C. The outgassing temperature is a property of the material forming the outgassing layer and is preferably higher than room temperature.

The outgassing layer can be formed completely on the electrode of the terminal, or it can be formed (partly or completely) on the body of the electronic component, the electrode or a part of the electrode surrounding the outgassing layer such that it can form a gastight seal together with the cover layer. The outgassing layer is sealed by the cover layer to form a sealed gas volume between the electrode and the cover layer when the body is soldered to a carrier. Particularly, once the out-gassing layer has been heated to the outgassing temperature, the gases resulting from the decomposition of the outgassing layer are released. However, as the out-gassing layer is sealed in a gastight manner between the cover layer and the electrode, the cover layer is inflated to form a hollow, flexible shell. Flexible means that the cover layer can be inflated and thereby bent and/or stretched to a certain extent without breaking. The cover layer can be, but is not necessarily elastic, i.e. able to regain its original dimensions before the component was heated to the soldering temperature.

The flexible shell reduces the mechanical stress in the solder joints between the terminal and the carrier (e.g. PCB) that arises from the TCE mismatch between the electronic component and the carrier and from mechanical bending of the carrier. As a result, the mounted electronic component is able to withstand a larger number of thermal cycles and vibration in comparison to a chip component having rigid solder joints, which increases the overall reliability of the electronic device. Moreover, the recited terminal design provides a flexible terminal without substantially increasing the overall dimensions of the electronic component.

Furthermore, the proposed terminal design ensures that electric current flows across metallic elements, as opposed to composite elements, which maintains high electrical linearity and conductivity of the terminals. This results in improved electrical characteristics of the mounted component.

The electronic component of claim 1 may be an electronic chip-type component whose terminals are provided with metallization e.g. on one, three or five sides.

In accordance with one embodiment, a material forming the body includes a ceramic, such as alumina ceramics. While this disclosure refers predominantly to ceramic-based components, the concept is applicable to any combination of materials that may result in a TCE mismatch between the body of the electronic component and the carrier. As such, within the scope of the invention the body may comprise any other kind of substrate. The materials concerned may include any one of a hybrid ceramic substrate, components that are not based on ceramics, or any other suitable combination of materials (e.g. combination of metal and non-metal materials). For example, the body may be formed by a component, for example a tantalum capacitor, that is conformal coated or molded by isolative compound and that has metallized ends, i.e. terminals. Another example may be a body having metallized ends of multilayer ceramic capacitor or multilayer varistor.

In accordance with another embodiment, the cover layer includes a material having a modulus of elasticity higher than the modulus of elasticity of a material comprised by the outgassing layer. Preferably, the modulus of elasticity of the material comprised by the cover layer is higher by several orders of magnitude than the modulus of elasticity of the material comprised by the outgassing layer. For example, a cover layer including chromium has a modulus of elasticity of about 200 GPa, while a jelly-like polymer outgassing layer including a metal-filled polymer has a modulus of elasticity of about 0.01 MPa. The relatively low modulus of elasticity of the outgassing layer enables the cover layer to freely bend when the cover layer is inflated.

In accordance with another embodiment, the adhesion between the outgassing layer and the cover layer is greater than the adhesion between the outgassing layer and the electrode surface. The relatively lower adhesion to the electrode surface enables the outgassing layer to separate from the electrode surface so that the cover layer may be inflated to form a hollow flexible shell while remaining adhered to the cover layer after inflation.

As already mentioned, in an embodiment the outgassing layer can include a conductive polymer.

In accordance with another embodiment, the outgassing layer includes a metal-filled silicone, for example silver-filled silicone, which is known to sufficiently out-gas at temperatures above 250° C. Alternatively, the material forming the outgas-sing layer may include any plateable, non-stable material that decomposes and emits gases at soldering temperatures. An outgassing layer is electrically conductive and can be plated by the cover layer together with any exposed portions of the electrode.

In accordance with an advantageous embodiment, the cover layer is flexible to allow deformation and remain gastight when the outgassing layer outgasses. In accordance with an embodiment, the material forming the cover layer includes, but is not restricted to, copper and/or nickel. The cover layer additionally serves as a leaching barrier to prevent dissolving of the exposed portion of the electrode in the molten solder during soldering.

In accordance with another embodiment, the outgassing layer is deposited on a surface of the electrode facing away from the chip body, with said electrode surface comprising a sealing boundary (e.g. a fringe) which is not covered by the out-gassing layer and at which the cover layer is electrically connected to the electrode. The exposed sealing boundary provides a particularly gastight seal and metallic conduction between the electrode surface and the cover layer. Preferably, the sealing boundary form a close circumference around the outgassing layer.

In accordance with another embodiment, the electronic component further comprises a plated finishing layer that facilitates soldering and is deposited on the cover layer (particularly on a part or several parts of the cover layer or on the complete cover layer). The plated finishing layer may include, but is not restricted to, tin, tin-lead alloys or gold.

In accordance with another embodiment, the outgassing layer is configured by screen printing onto the one or more electrode surfaces. Alternatively, the outgassing layer may be formed by dipping the terminal in conductive polymer ink. Both of these alternative embodiments enable the flexible terminals to be manufactured using the same equipment and major materials that are used to manufacture conventional leadless chip components.

As explained, the electronic component in accordance with any one of the previously described embodiments (i.e. having an outgassing layer formed on an electrode and having a cover layer formed on the outgassing layer and electrode) is used to solder the electronic component to a carrier, wherein the outgassing layer of the electronic component outgasses during the soldering process and inflates the cover layer to form a gas-filled volume between the electrode and the cover layer.

Moreover, an arrangement including an electronic component and a carrier is provided, in which an electronic component in accordance with any one of the previously described embodiments is connected to a carrier by a solder joint, wherein a gas-filled volume is formed between the electrode and the cover layer.

Furthermore, a method of soldering an electronic component in accordance with any one of the previously described embodiments to a carrier is provided, which comprises the steps of: providing the electronic component; providing a carrier having at least one connection pad; and soldering the at least one terminal of the electronic component to the at least one connection pad of the carrier, wherein the outgassing layer of the at least one terminal outgasses and forms a gas-filled volume between the electrode and the cover layer of the at least one terminal.

After soldering, the outgassing layer is not functional and also has no discernable influence on either the mechanical or the electrical properties of the terminal. With-in the scope of the invention, it is therefore not necessary that the outgassing layer is formed on the electrode of the terminal, i.e. this is only a preferred embodiment allowing for easier manufacture. However, for the purpose of sealing the outgassing layer in a gastight manner between the cover layer and the electrode it is in principle sufficient if the outgassing layer at least is surrounded by the electrode, particularly surrounded circumferentially in a closed manner. For example, the outgassing layer could be partly or fully arranged on a surface of the body of the electronic component.

BRIEF DESCRIPTION OF THE DRAWINGS

For the purpose of explanation, several embodiments of the electronic component are shown in the following figures.

The figures and the following description use corresponding reference numerals (same reference numerals or incremented by 100+s) for components that are common to various embodiments.

DETAILED DESCRIPTION OF THE PREFERRED EMBODIMENTS

Figure 1C:
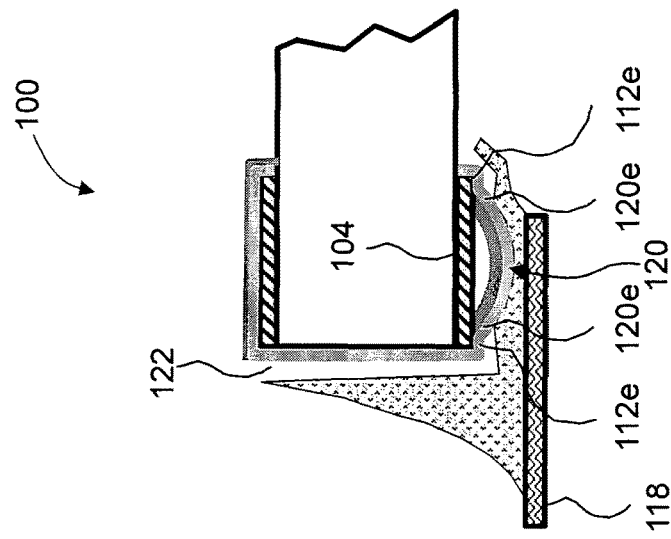
FIG. 1C shows a partial cross-section through the component of FIG. 1B after the application of cyclic stress.
Figure 1B:
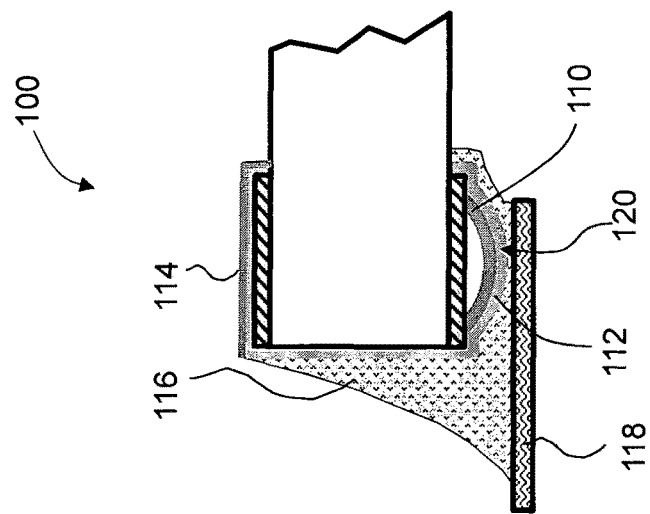
FIG. 1B shows a partial cross-section through the component of FIG. 1A after mounting on the carrier.
Figure 1A:
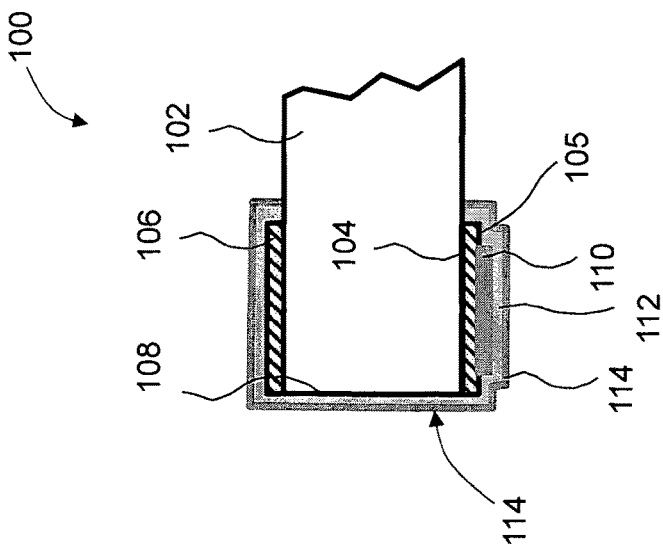
FIG. 1A shows a partial cross-section through the terminal of one embodiment of the chip component prior to mounting on the carrier, wherein metallization is formed on three sides of the chip component.

FIG. 1A to 1C show a partial cross-section through an electronic component comprising a chip body 102 and a chip terminal for soldering the chip body 102 to a carrier (e.g. a circuit board or a PCB), schematically represented by a solder pad 118 in FIGS. 1B and 1C. The electronic component of FIG. 1 has three-sided metallization, so the chip terminal includes a bottom electrode 104, a top electrode 106 and face side metallization 108 that electrically connects the top and bottom electrodes 104, 106. The designation "top" refers to the side of the chip body 102 facing away from the carrier, while "bottom" refers to the side of the chip body 102 facing towards the carrier. Similarly, while FIG. 1 only shows a partial cross section of the component, it is understood that the end of the component that is not shown in the figures can have the same configuration as in FIG. 1A to 1C.

The bottom electrode 104 is provided with an outgassing layer, formed by a layer of platable conductive polymer 110 deposited on the surface of the bottom electrode 104 such that the outgassing layer (conductive polymer layer 110) is formed on and surrounded by the electrode (bottom electrode 104). An electrically conductive cover layer, formed by a plated barrier layer 112, is deposited on the outer surface of the conductive polymer layer 110 (the surface of the conductive polymer layer 110 facing away from the bottom electrode 104), on the exposed portions of the bottom electrode 104, on the face side metallization 108 and on the top electrode 106. The barrier layer 112 is electrically connected to the bottom electrode 104 and seals the conductive polymer layer 110 in a gastight manner between the barrier layer 112 and the bottom electrode 104. The barrier layer 112 is coated with a plated finishing layer 114 that facilitates soldering of the component 100 to the circuit board.

As shown in FIG. 1B, the component of FIG. 1A is mounted to a carrier by forming a solder joint 116 between the terminal and a solder pad 118 provided on the carrier, which causes part of the finishing layer 114 to dissolve into the solder 116 (FIGS. 1B and 1C). During soldering, the temperature of the terminal is raised, causing the conductive polymer layer 110 to release a gas, i.e. to outgas, within the sealed space formed between the barrier layer 112 and the bottom electrode 104. The released gas inflates the barrier layer 112 to form a hollow flexible shell 120. To this end, the material forming the conductive cover layer (plated barrier layer 112) is sufficiently flexible.

The size of the hollow flexible shell 120 is essentially determined by the volume of and material selected for the conductive polymer layer 110, which determine the amount of gas released when the polymer layer 110 is heated to the outgassing temperature. The hollow flexible shell 120 comprises an edge portion 120e, which is bounded by an edge portion 112e of the barrier layer 112. The boundary formed by the edge portion 112e corresponds to a sealing boundary of the hollow flexible shell 120 where there is direct contact between the barrier layer 112 and a fringe portion 105 (FIG. 1A) of the surface of the bottom electrode 104, and corresponds to a demarcation between a flexible portion of the barrier layer 112 and a rigid portion of the barrier layer 112. As shown in FIG. 1B, the solder 116 is initially connected to both the rigid and flexible portions of the barrier layer 112.

The formation of the hollow flexible shell 120 is facilitated when a material forming the conductive polymer layer 110 is selected to have a greater relative adhesion to the barrier layer 112 than to the surface of the bottom electrode 104. In other words, the conductive polymer layer 110 has a low adhesion to the electrode surface, which causes the conductive polymer layer 110 to separate from the electrode 104 and remain on the barrier layer 112 when the conductive polymer layer 110 outgases.

FIG. 1C shows that once the solder joint 116 has been formed, the entire assembly may be subjected to temperature cycling and/or vibration, which causes a crack 122 to form between the solder joint 116 and the barrier layer 112. Increasing numbers of cycles causes the crack 122 to propagate along the rigid boundary of the terminal including portions 112e of the barrier layer 112. The continued expansion of the crack 122 results in the exposure of edges 120e of the hollow flexible shell 120. Once the edge portion 120e of the hollow flexible shell 120 have been exposed, the chip terminal of the component 100 is only electrically and mechanically connected to the solder 116 via the flexible portion of the barrier layer 112, which forms a flexible connection of the terminal to the solder pad 118. The flexible nature of the connection reduces the mechanical stress in the solder joint, hinders the further propagation of the crack 122, and increases the overall ability of the connection to withstand cyclical stress.

At the same time, the electrical connection is preserved and the electrical current is still able to travel from the terminals 104, 106 to the solder pad 118 to the carrier (circuit board) via the electrically conductive barrier layer 112 that is made of metal, and therefore has metallic-type (high and linear) conductivity. In this way, the electronic component 100 provides a mechanically flexible terminal without impairing the electrical characteristics of the component 100. In this way, high electrical conductivity and linearity of the flexible terminals are ensured.

Figure 2C:
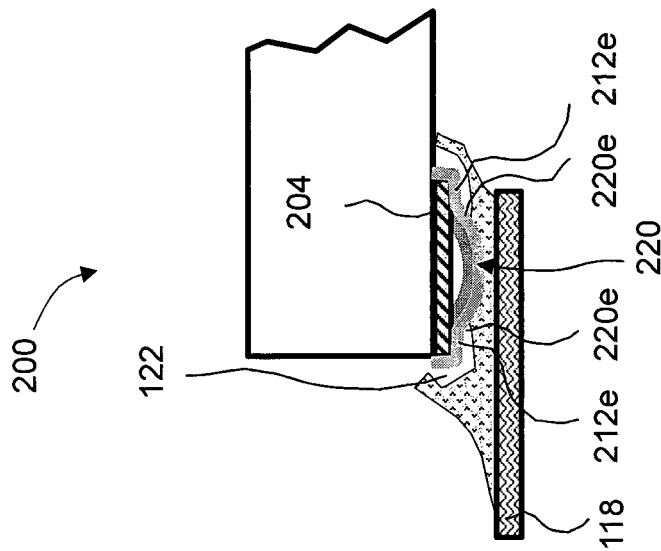
FIG. 2C shows a partial cross-section through the component of FIG. 2B after the application of cyclic stress.
Figure 2B:
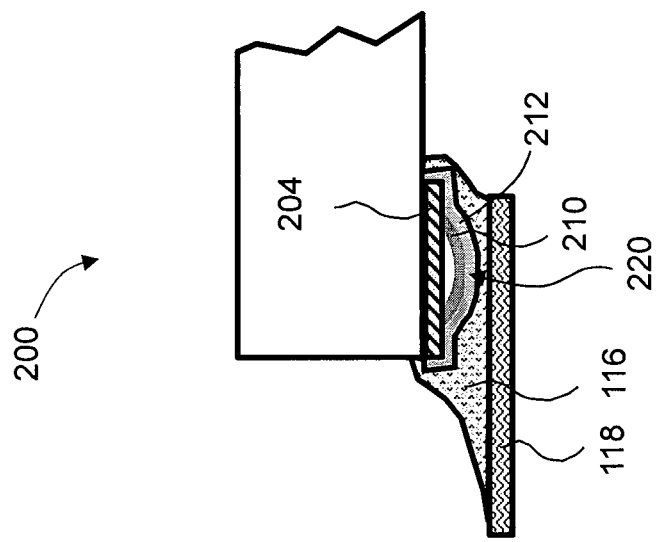
FIG. 2B shows a partial cross-section through the component of FIG. 2A after mounting on the carrier.
Figure 2A:
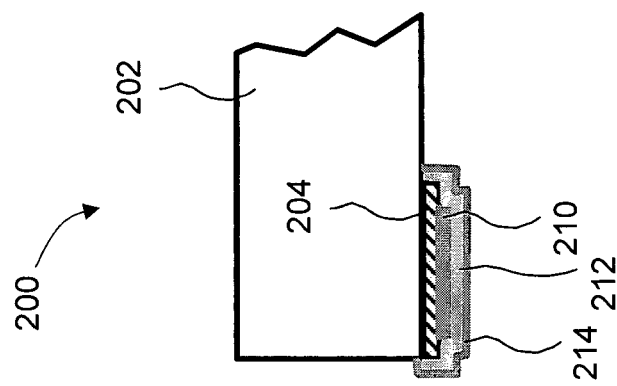
FIG. 2A shows a partial cross-section through the terminal of one embodiment of the chip component prior to mounting on the carrier, wherein metallization is formed on one side of the chip component.

FIG. 2A to 2C correspond essentially to FIG. 1A to 1C but show a further embodiment of an electronic component 200 having metallization on only one side of the chip terminal. Accordingly, the component 200 comprises only a bottom electrode 204, on which an outgassing layer (conductive polymer layer 210) and a cover layer (plated barrier layer 212) are deposited respectively. Again, the barrier layer 212 is coated by finishing layer 214. As can be seen in FIG. 2B, when the terminal and particularly the conductive polymer layer 210 is heated during soldering, the conductive polymer layer 210 outgasses, which causes the barrier layer 212 to form a hollow flexible shell 220. As shown in FIG. 2C, a crack 122 formed between the solder joint 116 and the barrier layer 212 due to temperature cycling and/or vibration is prevented from propagating along the entire terminal since the flexible portion of the barrier layer 212 preserves the mechanical and electrical connection between the solder joint 116 and the bottom electrode 204.

Figure 3C:
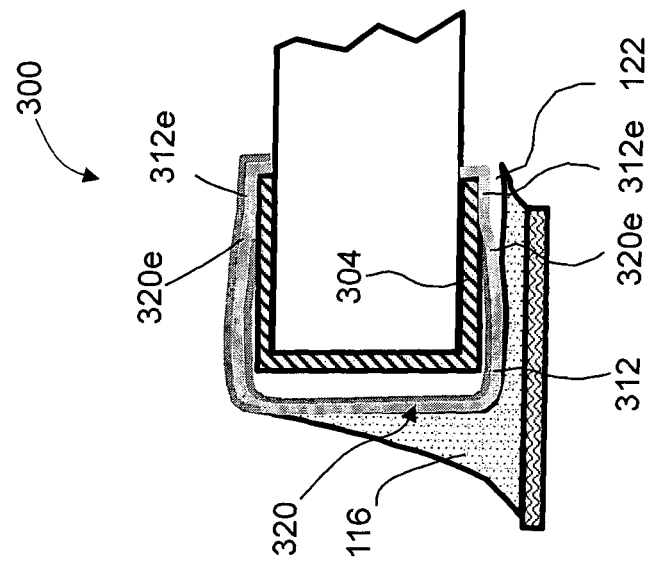
FIG. 3C shows a partial cross-section through the component of FIG. 3B after the application of cyclic stress.
Figure 3B:
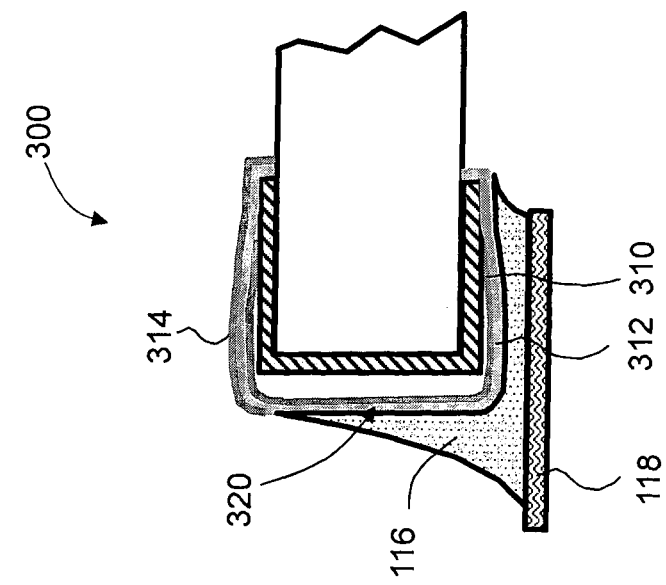
FIG. 3B shows a partial cross-section through the component of FIG. 3A after mounting on the carrier.
Figure 3A:
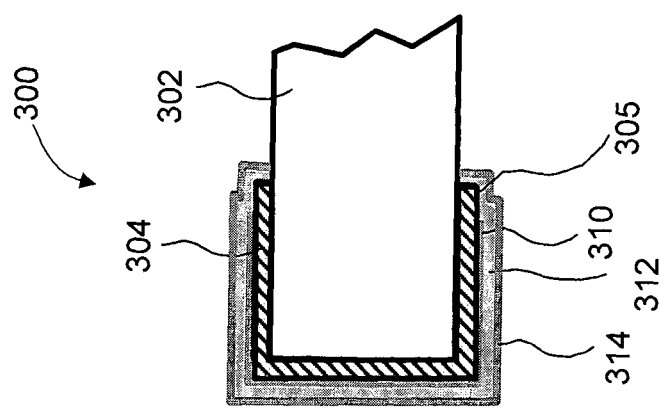
FIG. 3A shows a partial cross-section through the terminal of one embodiment of the chip component prior to mounting on the carrier, wherein metallization is formed on five sides of the chip component.

FIG. 3A to 3C show a further embodiment of an electronic component 300 provided with metallization on five sides of the terminal. The terminal comprises an electrode 304 that circumferentially wraps around the end of the chip body 302 and completely covers its front surface. An outgassing layer (conductive polymer layer 310) is formed on the front surface and on parts of the top, bottom and two side surfaces of the electrode 304, excluding a fringe portion 305, and accordingly wraps around the edges of the chip body 302 and terminal (whereas the conductive polymer layer 310 of the embodiments shown in FIGS. 1 and 2 are arranged solely on the respective bottom electrodes 104, 204). A cover layer (barrier layer 312) completely covers the conductive polymer layer 310 and the fringe portion 305 of the electrode 304 at the edges of the conductive polymer layer 310 along a closed circumference of the chip body 302.

Due to the configuration of the conductive polymer layer 310, the edge portions 312e of the barrier layer 312 are arranged on the top, bottom and two side surfaces of the chip body 302. As the solder 116 does not extend onto the top surface of the chip terminal, only the edge portion 312e provided on the bottom side of the chip terminal (and possibly parts of the edge portions 312e provided on the two side surfaces) make(s) contact with the solder 116. Accordingly, when the electronic component 300 is subjected to mechanical and/or thermal stress, a crack 122 essentially forms on the bottom side of the chip terminal (FIG. 3C). A gas volume is formed mainly at the front surface of the chip body 302, but extends to the top, bottom and two side surfaces. The solder joint 116 remains in contact with the hollow flexible shell 320 at the front surface of the chip body 302 (as shown in the left part of FIG. 3C) and with parts of the bottom and two side surfaces of the chip body 302.

The embodiments shown in FIG. 1 to 3 can be, but are not necessarily, manufactured using existing chip manufacturing technology. For the components 100, 200 having metallization on one or three sides, the conductive polymer layer 110, 210 can for example be screen-printed on a middle portion of the outer surface of the bottom electrode 104, 204. The screen-printing step for the conductive polymer layer 110, 210 is preferably the final screen-printing operation during the manufacture of the components 100, 200.

In contrast, the conductive polymer layer 310 can be deposited on the component 300 having metallization on five sides by dipping the electrode 304 into conductive polymer ink. The dipping step preferably occurs just before the plating of the terminal. Furthermore, it is preferably ensured during the dipping step that a fringe portion 305 of the electrode 304 remains uncovered by conductive polymer ink.

After depositing the conductive polymer layer 110, 210, 310 the barrier layer 112, 212, 312 is applied to seal the polymer layer 110, 210, 310 between the electrode 104, 204, 304 and the barrier layer 112, 212, 312. Specifically, the edge portion 112e, 212e, 312e forms a sealing boundary where there is direct contact between the electrode 104, 204, 304 (fringe portion 105, 305) and the barrier layer 112, 212, 312. After the barrier layer 112, 212, 312 has been applied, an optional finishing layer 114, 214, 314 is plated on the barrier layer 112, 212, 312 to finish the chip terminals.

During the manufacturing steps carried out after depositing the conductive polymer layer 110, 210, 310 the temperature of the component 100, 200, 300 is kept below the outgassing temperature of the conductive polymer layer 110, 210, 310, until soldering takes place.

REFERENCE SIGNS 100, 200, 300 electronic component
102, 202, 302 chip body
104, 204, 304 bottom electrode or electrode
105, 305 fringe portion
106 top electrode
108 face side metallization
110, 210, 310 outgassing layer or conductive polymer layer
112, 212, 312 cover layer or plated barrier layer
112e, 212e, 312e edge portion of the plated barrier layer
114, 214, 314 plated finishing layer
116 solder joint
118 solder pad
120, 220, 320 hollow flexible shell
120e, 220e, 320e edge portion of the hollow flexible shell
122 fatigue crack

The invention claimed is:

1. An electronic component comprising a body and at least one terminal for soldering the body to a carrier, wherein the terminal comprises:
    an electrode arranged on a surface of the body;
    an outgassing layer formed on and/or surrounded by the electrode, wherein the outgassing layer is configured to outgas when being heated; and
    an electrically conductive cover layer formed on the outgassing layer, wherein the cover layer is electrically connected to the electrode and seals the outgassing layer in a gastight manner between the cover layer and the electrode,
    and
    wherein the cover layer is configured to inflate to form a hollow flexible shell formed at least in part by the cover layer when the outgassing layer is heated and outgasses,
    wherein an adhesion between the outgassing layer and the cover layer is greater than an adhesion between the outgassing layer and the electrode, and
    wherein the outgassing layer is deposited on a surface of the electrode facing away from the body, with said electrode surface comprising a sealing boundary which is not covered by the outgassing layer and at which the cover layer is electrically connected to the electrode.

2. The electronic component of claim 1, wherein a material forming the body includes ceramics.

3. The electronic component of claim 2, wherein the material forming the body includes alumina ceramics.

4. The electronic component of claim 1, wherein the cover layer includes a material having a modulus of elasticity higher than the modulus of elasticity of a material comprised by the outgassing layer.

5. The electronic component of claim 1, wherein the outgassing layer includes a conductive polymer.

6. The electronic component of claim 1, wherein the outgassing layer includes a metal-filled silicone.

7. The electronic component of claim 6, wherein the outgassing layer includes silver-filled silicone.

8. The electronic component of claim 1, wherein the cover layer includes at least one of copper and nickel.

9. The electronic component of claim 1, further comprising a plated finishing layer deposited on the cover layer.

10. The electronic component of claim 1, wherein the outgassing layer is screen printed onto the electrode.

11. The electronic component of claim 1, wherein the outgassing layer is configured by clipping the terminal in conductive polymer ink.

12. A method of soldering an electronic component to a carrier, the electronic component comprising a body and at least one terminal for soldering the body to a carrier, wherein the terminal comprises:

an electrode arranged on a surface of the body;

an outgassing layer formed on and surrounded by the electrode, wherein the outgassing layer is configured to outgas when being heated; and an electrically conductive cover layer formed on the outgassing layer, wherein the cover layer is electrically connected to the electrode and seals the outgassing layer in a gastight manner between the cover layer and the electrode, the method comprising the steps of:

providing the electronic component;

providing the carrier having at least one connection pad; and soldering the at least one terminal of the electronic component to the at least one connection pad of the carrier, wherein gas emitted from the outgassing layer of the at least one terminal inflates the cover layer to form a gas-filled volume between the electrode and the cover layer of the at least one terminal;

and wherein the cover layer is configured to inflate to form a hollow flexible shell formed at least in part by the cover layer when the outgassing layer is heated and outgasses, wherein an adhesion between the outgassing layer and the cover layer is greater than an adhesion between the outgassing layer and the electrode, and wherein the outgassing layer is deposited on a surface of the electrode facing away from the body, with said electrode surface comprising a sealing boundary which is not covered by the outgassing layer and at which the cover layer is electrically connected to the electrode.

* * * * *